(12) United States Patent
Tufvesson et al.

(10) Patent No.: US 10,180,890 B2
(45) Date of Patent: Jan. 15, 2019

(54) SYSTEMS AND METHODS FOR MONITORING HARDWARE OBSERVATION POINTS WITHIN A SYSTEM ON A CHIP (SOC)

(71) Applicant: Telefonaktiebolaget L M Ericsson (publ), Stockholm (SE)

(72) Inventors: Peter Tufvesson, Bjärred (SE); Alberth Arvidsson, Malmö (SE); Erik Ledfelt, Vellinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 786 days.

(21) Appl. No.: 14/309,274

(22) Filed: Jun. 19, 2014

(65) Prior Publication Data

US 2015/0370678 A1 Dec. 24, 2015

(51) Int. Cl.
*G06F 11/30* (2006.01)
*G01R 31/317* (2006.01)

(52) U.S. Cl.
CPC .... *G06F 11/3013* (2013.01); *G01R 31/31705* (2013.01); *G06F 11/3062* (2013.01);
(Continued)

(58) Field of Classification Search
USPC .......................................................... 714/33
See application file for complete search history.

(56) References Cited

U.S. PATENT DOCUMENTS 6,857,029 B2 * 2/2005 Ganasan .................. G06F 1/12
702/182
8,230,433 B2 * 7/2012 Chiu .................. G06F 11/3409
712/227

(Continued)

FOREIGN PATENT DOCUMENTS

CN 104572515 A * 4/2015

OTHER PUBLICATIONS

Gang, Wang et al., "On-chip Debug Architecture for MCU-DSP Core Based System-on-Chip," IEEE International Conference on Computer Science and Automation Engineering (CSAE), vol. 2, Jun. 10-12, 2011, Shanghai, China, IEEE, pp. 605-608.
(Continued)

*Primary Examiner* — Amine Riad
(74) *Attorney, Agent, or Firm* — Withrow & Terranova, PLLC

(57) ABSTRACT

Systems and methods for monitoring hardware observation points within a System on a Chip (SoC) are disclosed. In one embodiment, a monitoring system includes observers electrically coupled to corresponding hardware observation points. For each observation time period, the observer receives events from a corresponding hardware observation point and outputs observation data indicative of the number of events received. Each observer operates in the same clock and power domain as the corresponding hardware observation point. The hardware monitoring system includes collectors; each collector receives the observation data from a corresponding observer for the observation time period(s). Each collector updates a value of a live-counter based on the observation data and outputs the value of the live-counter. By counting the number of events at the hardware observation points, the monitoring system can enable detailed runtime monitoring, which can be used, e.g., for optimizing future hardware iterations and to support software power optimizations.

23 Claims, 9 Drawing Sheets

(52) U.S. Cl.
CPC .... *G06F 11/3096* (2013.01); *G01R 31/31723* (2013.01); *G06F 2201/86* (2013.01); *G06F 2201/88* (2013.01)

(56) References Cited

U.S. PATENT DOCUMENTS

| | | | | |
|---|---|---|---|---|
| 8,295,542 | B2* | 10/2012 | Albertson | G06K 9/00335 |
| | | | | 382/103 |
| 8,543,776 | B2* | 9/2013 | Zhong | G06F 11/3648 |
| | | | | 710/22 |
| 9,009,541 | B2* | 4/2015 | Gulati | G06F 11/22 |
| | | | | 714/37 |
| 9,363,130 | B2* | 6/2016 | Nguyen | H04L 27/367 |
| 9,389,979 | B2* | 7/2016 | Mangano | G06F 11/3648 |
| 2001/0034597 | A1 | 10/2001 | Swoboda et al. | |
| 2002/0120815 | A1 | 8/2002 | Zahavi et al. | |
| 2006/0005083 | A1* | 1/2006 | Genden | G06F 11/3409 |
| | | | | 714/47.1 |
| 2007/0038790 | A1* | 2/2007 | Lee | G06F 11/221 |
| | | | | 710/113 |
| 2009/0249122 | A1 | 10/2009 | Nadehara | |
| 2010/0191612 | A1* | 7/2010 | Raleigh | G06Q 10/06375 |
| | | | | 705/26.1 |
| 2010/0281309 | A1* | 11/2010 | Laurenti | G06F 11/3013 |
| | | | | 714/45 |
| 2010/0332927 | A1 | 12/2010 | Kurts et al. | |
| 2011/0029830 | A1* | 2/2011 | Miller | G06F 11/221 |
| | | | | 714/734 |
| 2012/0227045 | A1* | 9/2012 | Knauth | G06F 9/3863 |
| | | | | 718/100 |
| 2013/0246820 | A1* | 9/2013 | Branover | G06F 1/3296 |
| | | | | 713/320 |
| 2013/0346800 | A1 | 12/2013 | Gulati et al. | |
| 2014/0006836 | A1 | 1/2014 | Menon et al. | |
| 2014/0013157 | A1 | 1/2014 | Hopkins | |
| 2014/0053026 | A1 | 2/2014 | Zhong et al. | |
| 2014/0143463 | A1* | 5/2014 | Mou | G06F 11/349 |
| | | | | 710/110 |
| 2015/0186311 | A1* | 7/2015 | Yap | G06F 1/32 |
| | | | | 710/308 |
| 2016/0154449 | A1* | 6/2016 | Lim | G06F 1/3296 |
| | | | | 713/322 |

OTHER PUBLICATIONS

Hu, Xiao et al., "TraceDo: An On-Chip Trace System for Real-Time Debug and Optimization in Multiprocessor SoC," Parallel and Distributed Processing and Applications: Proceedings of the 4th International Symposium (ISPA), vol. 4330, Dec. 4-6, 2006, Sorrento, Italy, Springer Berlin Heidelberg, pp. 806-817.

International Search Report for International Patent Application No. PCT/EP2015/063306, dated Sep. 10, 2015, 4 pages.

* cited by examiner

SYSTEMS AND METHODS FOR MONITORING HARDWARE OBSERVATION POINTS WITHIN A SYSTEM ON A CHIP (SOC)

FIELD OF THE DISCLOSURE

The present disclosure relates to monitoring hardware observation points within a System on a Chip (SoC).

BACKGROUND

A System on a Chip (SoC) is an integrated circuit (IC) that integrates all or most components of a computer or other electronic system into a single chip. An SoC may contain both digital and analog components on a single chip substrate. SoCs are commonly used in mobile electronics and embedded systems because of their low power consumption and compact size.

The complexity of the hardware and software for SoCs makes it difficult to predict and detect the activity in various hardware components in the SoC during runtime. Specifically, a multitude of clocks, tasks, and other activities in the hardware all consume power. Estimating, optimizing, and debugging power consumption requires detailed knowledge of how the software uses the hardware. One method of hardware monitoring is to physically create observation points inside the SoC. For instance, a clock can be observed on a hardware pin as a toggling signal using a logic analyzer or oscilloscope. Also, these observation points can be made accessible to an outside debugger using a Joint Test Action Group (JTAG) connection.

Using hardware observation points enables hardware monitoring in a non-invasive manner without affecting the normal operation of the SoC. But, this method of hardware monitoring has several drawbacks. First, clocks and other signals often use high frequencies. For instance, many SoCs include a clock with a frequency greater than 1 gigahertz (GHz). Signals with such high frequencies are very difficult, if not impossible, to observe on normal pins. Second, the method does not scale well when more and more signals are to be observed. Signals may be multiplexed in order to keep the number of pins feasible, but then it is only possible to monitor a subset of all desired observation points at a single time. Third, external measurement equipment capable of monitoring these observation points may be expensive or large. This expense and size may be prohibitive in some applications. Fourth, synchronizing the measurements from these observation points with other activities, such as a trace from a CPU or input stimuli (like radio data for mobile devices), may be difficult.

As such, there is a need for improved hardware monitoring that addresses these issues.

SUMMARY

Systems and methods for monitoring hardware observation points within a System on a Chip (SoC) are disclosed. In one embodiment, a monitoring system includes observers electrically coupled to corresponding hardware observation points in the SoC. Each observer is adapted to, for each observation time period of one or more observation time periods for the observer, receive a number of events from a corresponding hardware observation point during the observation time period. Also, for each observation time period, the observer is adapted to output observation data indicative of the number of events received from the corresponding hardware observation point during the observation time period. Each observer operates in the same clock and power domain of the SoC as the corresponding hardware observation point. The hardware monitoring system also includes collectors, where each collector is adapted to receive the observation data from a corresponding observer for the one or more observation time periods for the corresponding observer. Each collector is also adapted to update a live-counter based on the observation data from the corresponding observer for each of the one or more observation time periods and, subsequently, to output the live-counter. By counting the number of events at each of the hardware observation points, the monitoring system can, in some embodiments, enable detailed runtime monitoring, which can be used, e.g., for optimizing future hardware iterations and to support software power optimizations.

In one embodiment, each observer in the monitoring system includes an event input port electrically coupled to a corresponding hardware observation point, a data output port, and circuitry. The circuitry is adapted to, for each observation time period of the one or more observation time periods of the observer, maintain a counter indicative of the number of events received via the event input port during the observation time period. The circuitry is also adapted to output the observation data on the data output port for each observation time period of the one or more observation time periods of the observer. The observation data is indicative of the number of events received via the event input port during the observation time period.

In one embodiment, each collector in the monitoring system includes an observation data input port adapted to receive the observation data from a corresponding observer among the plurality of observers and circuitry. The circuitry is adapted to, for each observation time period of the one or more observation time periods of the corresponding observer, receive, via the observation data input port, the observation data from the corresponding observer for the observation time period. The circuitry is also adapted to, for each observation time period of the one or more observation time periods of the observer, update the value of the live-counter based on the observation data.

In one embodiment, at least one observer is further adapted to filter an event stream from the corresponding hardware observation point based on an operating point of the corresponding hardware observation point to provide a filtered event stream. The number of events received from the corresponding hardware observation point during the observation time period is a number of events received in the filtered event stream during the observation time period.

In one embodiment, at least one observer includes two or more event input ports electrically coupled to the corresponding hardware observation point, a multiplexer having two or more multiplexer input ports electrically coupled to the two or more event input ports and a multiplexer output port, and a data output port. The at least one observer also has circuitry adapted to, for each observation time period of the one or more observation time periods of the observer, maintain a counter indicative of the number of events received on a select one of the two or more event input ports at the multiplexer output port during the observation time period, and output the observation data on the data output port. The observation data is indicative of the number of events received on the select one of the two or more event input ports during the observation time period.

In one embodiment, the monitoring system also includes a collector hub adapted to receive a trigger to capture the value of the live-counter of one or more collectors. In response to the trigger, for each value of the live-counter of the one or more collectors, the collector hub is adapted to obtain the value of the live-counter from the collector, store the value of the live-counter as a corresponding value of a frozen-counter of a plurality of frozen-counters for the plurality of collectors, time-stamp the corresponding value of the frozen-counter, and output the corresponding value of the frozen-counter including the time-stamp of the corresponding value of the frozen-counter.

In one embodiment, the collector hub includes live-counter input ports. Each live-counter input port is electrically coupled to the data output port of a corresponding collector. The collector hub also includes a controller unit configured to receive a trigger to capture the value of the live-counter of one or more of the collectors. In response to the trigger, for each value of the live-counter among the one or more collectors, the collector hub is adapted to obtain the value of the live-counter from the live-counter input port of the collector, store the value of the live-counter as a corresponding value of a frozen-counter, time-stamp the corresponding value of the frozen-counter, and output the corresponding value of the frozen-counter including the time-stamp of the corresponding value of the frozen-counter.

In one embodiment, each collector and the collector hub operate in the same clock and power domain. In one embodiment, each collector operates in the same clock and power domain. In one embodiment, at least one observer operates in a clock and power domain that is different from the clock and power domain of the collectors. In one embodiment, the monitoring system also includes power translation circuitry configured to translate communications between the clock and power domain of the at least one observer and the clock and power domain of the collectors. In one embodiment, at least two of the hardware observation points operate in different clock and power domains.

In one embodiment, at least one observer is located inside the corresponding hardware observation point. In one embodiment, at least one observer is located adjacent to the corresponding hardware observation point.

In one embodiment, the observation data sent from an observer to a collector is a bit pattern from a defined set of bit patterns, each corresponding to a different adjustment to the value of the live-counter. In one embodiment, a first bit pattern of the defined set of bit patterns corresponds to an increment to the value of the live-counter by a first value, and a second bit pattern of the defined set of bit patterns corresponds to an increment to the value of the live-counter by a second value that is different from the first value.

In one embodiment, at least one observer is configurable. In one embodiment, the configuration may be a configuration indicative of which event type from two or more event types of the hardware observation point are to be counted, a configuration indicative of when to receive events from the hardware observation point based on an operating point value, a configuration indicative of a length of the observation time period, or a configuration enabling the observer. In one embodiment, each observer is configurable via a same one or more configuration signals.

In one embodiment, the circuitry of each observer is adapted to, for each observation time period of the one or more observation time periods of the observer, maintain the counter as the summation of the number of events received via the event input port during the observation time period and a number of events received but not reported as observation data for any previous observation time period. Also, the circuitry of each observer is further adapted to decrement the counter by an amount indicated by the observation data output on the data output port.

In one embodiment, the collector hub is adapted to receive a trigger to capture the value of the live-counter of one or more collectors by receiving a hardware trigger via a cross-trigger interface, by receiving a software trigger, or by receiving a recurring trigger based on a timer.

In one embodiment, the collector hub is adapted to output the corresponding value of the frozen-counter including the time-stamp of the corresponding value of the frozen-counter by allowing the corresponding value of the frozen-counter, including the time-stamp of the corresponding value of the frozen-counter, to be read by software. In one embodiment, the collector hub is adapted to output the corresponding value of the frozen-counter, including the time-stamp of the corresponding value of the frozen-counter, by sending the corresponding value of the frozen-counter, including the time-stamp of the corresponding value of the frozen-counter, over a trace interface.

In one embodiment, the monitoring system includes a collector hub adapted to receive a trigger to capture the value of the live-counter of one or more subsets of collectors. In response to the trigger, for each subset in the one or more subsets, for each live-counter of the subset of the collectors, the collector hub is adapted to obtain the value of the live-counter from the collector, store the value of the live-counter as a corresponding value of the frozen-counter, time-stamp each value of the frozen-counter corresponding to the subset of the collectors, and output the corresponding value of the frozen-counter, including the time-stamp of the corresponding value of the frozen-counter.

In one embodiment, a method for monitoring a hardware observation point within an SoC includes receiving, by an observer, a number of events from the hardware observation point during an observation time period and outputting observation data indicative of the number of events received from the hardware observation point during the observation time period. The method also includes receiving, by a collector, the observation data from the observer for the observation time period, and updating a value of a live-counter based on the observation data from the observer for the observation time period. The method also includes repeating the steps of receiving a number of events, outputting observation data, receiving the observation data, updating the value of the live-counter for one or more additional observation time periods, and outputting the value of the live-counter.

In one embodiment, the method also includes receiving, by a collector hub, a trigger to capture the value of the live-counter of the collector. The method also includes, in response to the trigger, obtaining the value of the live-counter from the collector, storing the value of the live-counter as a corresponding value of a frozen-counter, time-stamping the corresponding value of the frozen-counter, and outputting the corresponding value of the frozen-counter, including the time-stamp of the corresponding value of the frozen-counter.

Those skilled in the art will appreciate the scope of the present disclosure and realize additional aspects thereof after reading the following detailed description of the embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
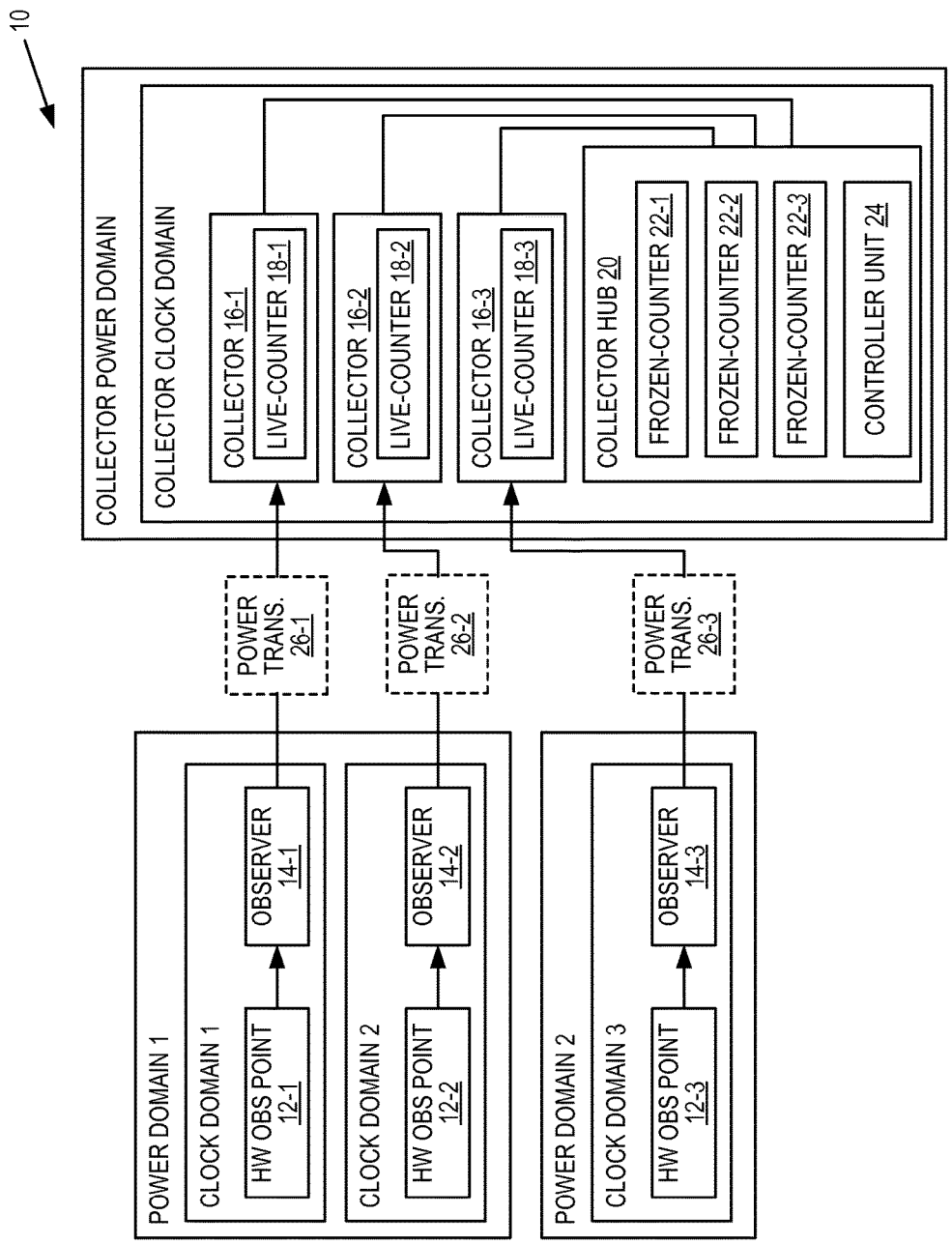
FIG. 1 is a block diagram of a monitoring system within a System on a Chip (SoC) for monitoring hardware observation points within the SoC according to one embodiment of the present disclosure.

Systems and methods for monitoring hardware observation points within a System on a Chip (SoC) are disclosed. In this regard, FIG. 1 is a block diagram of a monitoring system 10 within an SoC for monitoring hardware observation points 12-1 through 12-3 (generally referred to herein collectively as hardware observation points 12 and individually as hardware observation point 12) within the SoC according to one embodiment of the present disclosure. Note that only three hardware observation points 12 are illustrated for clarity and ease of discussion. However, the monitoring system 10 may be used to monitor any number of hardware observation points 12 (e.g., 10 s, 100 s, or more).

As illustrated, the monitoring system 10 includes observers 14-1 through 14-3 (generally referred to herein collectively as observers 14 and individually as observer) that are electrically coupled to the corresponding hardware observation points 12-1 through 12-3. The observers 14 are hardware, or circuitry, that generally operate to observe, or count, events relating to the operation of the corresponding hardware observation points 12. The hardware observation points 12 can be any type of hardware implemented in an SoC. For example, the hardware observation points 12 may include various clock pins, components in a processor (e.g., Central Processing Units (CPUs)), states in a finite state machine (FSM), or the like. In the illustrated example, the observers 14 are implemented separate from (e.g., adjacent to) the corresponding hardware observation points 12. However, in another embodiment, one or more, and potentially all, of the observers 14 are implemented within the corresponding hardware observation points 12.

The observers 14 are implemented in the same clock domain and the same power domain as the corresponding hardware observation points 12. As will be appreciated by one of ordinary skill in the art, different power domains of the SoC are portions of the SoC that operate at different power levels (e.g., 3V vs. 5V). Also, some power domains operate at the same power level but are capable of being deactivated separately than other parts of the SoC. Different clock domains are portions of the SoC that operate at different clock frequencies. In this example, the hardware observation point 12-1 and the observer 14-1 are implemented in a first power domain (Power Domain 1) of the SoC and a first clock domain (Clock Domain 1) of the SoC. In this regard, the hardware observation point 12-1 and the observer 14-1 are referred to herein as being implemented in the same clock and power domain (i.e., the same clock domain and the same power domain). Likewise, the hardware observation point 12-2 and the observer 14-2 are implemented in the first power domain (Power Domain 1) of the SoC and a second clock domain (Clock Domain 2) of the SoC. In this regard, the hardware observation point 12-2 and the observer 14-2 are referred to herein as being implemented in the same clock and power domain (i.e., the same clock domain and the same power domain). Lastly, the hardware observation point 12-3 and the observer 14-3 are implemented in a second power domain (Power Domain 2) of the SoC and a third clock domain (Clock Domain 3) of the SoC. In this regard, the hardware observation point 12-3 and the observer 14-3 are referred to herein as being implemented in the same clock and power domain (i.e., the same clock domain and the same power domain). Thus, in this example, the hardware observation points 12-1 through 12-3 (and thus the observers 14-1 through 14-3) are all implemented in different clock and power domains. However, the present disclosure is not limited thereto. Notably, as used herein, two elements are said to operate in different clock and power domains if the two elements operate in different clock domains, in different power domains, or in both different clock domains and different power domains.

The monitoring system 10 also includes collectors 16-1 through 16-3 (generally referred to herein collectively as collectors 16 and individually as collector 16) that are electrically coupled to the corresponding observers 14-1 through 14-3. Each of the collectors 16 corresponds to one of the observers 14 (e.g., the collector 16-1 corresponds to the observer 14-1, etc.). As discussed below in detail, the collectors 16-1 through 16-3 maintain live-counters 18-1 through 18-3 (generally referred to herein collectively as live-counters 18 and individually as live-counter 18), respectively. In general, each of the collectors 16 maintains the live-counter 18 of the collector based on observation data received from the corresponding observer 14 over one or more observation time periods. For each observation time period, the observation data is indicative of a number of events received by the observer 14 from the hardware observation point 12 during the observation time period. As a result, the live-counter 18 serves as a counter of the number of events observed from the corresponding hardware observation point 12 over the one or more observation time periods.

Lastly, the monitoring system 10 includes a collector hub 20. The collector hub 20 is implemented in hardware or a combination of hardware and software. In general, the collector hub 20 operates to obtain values from the live-counters 18-1 through 18-3 and store the values, along with time-stamps, in corresponding frozen-counters 22-1 through 22-3 (generally referred to herein collectively as frozen-counters 22 and individually as frozen-counter 22) in response to one or more triggering events, e.g., from an external debug system. The collector hub 20 also includes a controller unit 24 that controls the operation of the collector hub 20 and, in some embodiments, performs other functions such as, e.g., configuring the observers 14.

In this embodiment, the collectors 16 and the collector hub 20 are implemented on the same clock domain (Collector Clock Domain) and the same power domain (Collector Power Domain). In this manner, the collectors 16 and the collector hub 20 are implemented in the same clock and power domain. Further, in this example, the collector clock and power domain is different from the clock and power domains of the hardware observation points 12 and the corresponding observers 14. Note that while all of the hardware observation points 12 and the corresponding observers 14 in the illustrated example are implemented in clock and power domains that are different from those of the collectors 16 and the collector hub 20, in some embodiments, one or more of the hardware observation points 12 and the corresponding observers 14 may be implemented in the same clock and power domain as the collectors 16 and the collector hub 20. In this example, since the observers 14 and the collectors 16 are implemented in different power domains, the monitoring system 10 includes power translation circuitry 26-1 through 26-3 (generally referred to herein collectively as power translation circuitry 26 and individually as power translation circuitry 26).

Figure 2:
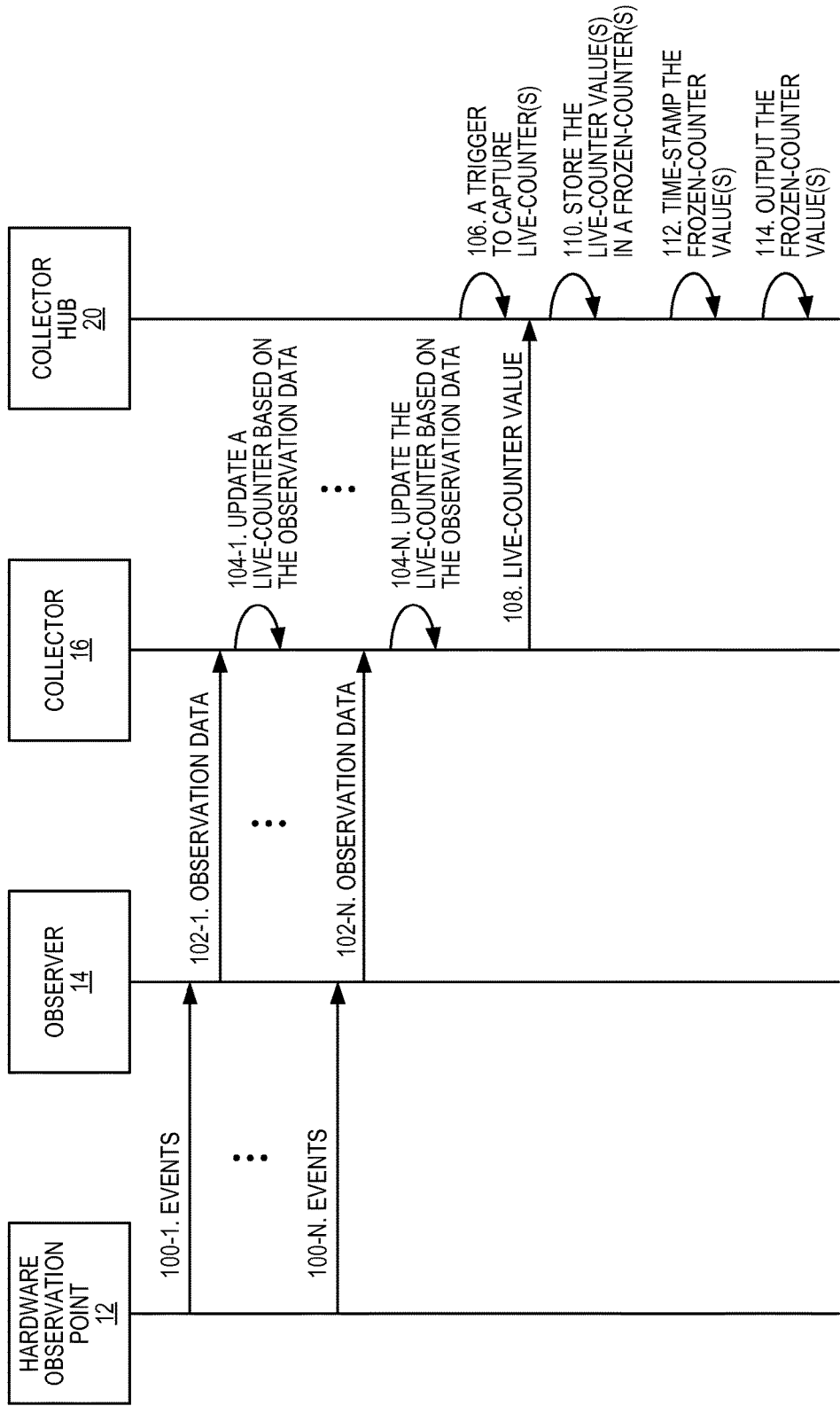
FIG. 2 illustrates the operation of the monitoring system of FIG. 1 according to one embodiment of the present disclosure.

FIG. 2 illustrates the operation of the monitoring system 10 of FIG. 1 for monitoring one of the hardware observation points 12 within the SoC according to one embodiment of the present disclosure. Note that this discussion is equally applicable to the monitoring of the other hardware observation points 12. As illustrated, the observer 14 receives events from the corresponding hardware observation point 12 during a first observation time period (step 100-1). Note that observers 14 may or may not have the same observation time periods. For example, the observers 14 may use observation time periods that are of different durations, or may use observation time periods that are of the same duration but are not synchronized. In one embodiment, the observers 14 are configured with the desired observation time period(s) for the observers 14. Further, the observers 14 may be configured individually, in sets of one or more observers 14, or all together.

At the end of the first observation time period, the observer 14 outputs observation data indicative of the number of events received from the corresponding hardware observation point 12 during the first observation time period to the corresponding collector 16 (step 102-1). In one embodiment, the observation data is a value that represents the exact number of events received from the hardware observation point 12 during the first observation time period. In another embodiment, the observation data is a value that is an approximation of the number of events received from the hardware observation point 12 during the first observation time period. For example, in one embodiment, the observation data is a bit pattern that is mapped to one of a set of predefined increment value(s) and, in some embodiments, decrement value(s) for the live-counter 18 of the collector 16. In response, the collector 16 updates the live-counter 18 of the collector 16 based on the observation data for the first observation time period (step 104-1).

This process is repeated for one or more additional observation time periods. Referring to the N-th observation time period, the observer 14 receives events from the hardware observation point 12 during the N-th observation time period (step 100-N). At the end of the N-th observation time period, the observer 14 outputs observation data indicative of the number of events received from the corresponding hardware observation point 12 during the N-th observation time period to the corresponding collector 16 (step 102-N). In one embodiment, the observation data is a value that represents the exact number of events received from the hardware observation point 12 during the N-th observation time period. In another embodiment, the observation data is a value that is an approximation of the number of events received from the hardware observation point 12 during the N-th observation time period and any unreported events from the previous observation time period(s). In response to the observation data for the N-th observation time period, the collector 16 updates the live-counter 18 of the collector 16 based on the observation data for the N-th observation time period (step 104-N). At the end of the N-th observation time period, the live-counter 18 stores a count value (i.e., a live-counter value) that is indicative of (e.g., exactly equal to or approximately equal to) the number of events that the observer 14 received from the hardware observation point 12 over all N observation time periods.

The events received by the observer 14 can represent a wide variety of signals or states in the SoC. For instance, the hardware observation point 12 may measure a signal and send events on each rising edge (or falling edge, or low or high value) of the signal. For example, if the hardware observation point 12 is measuring the clock signal of a processor and reporting events on each rising edge of the clock signal, the observer 14 would output observation data for each observation time period that is indicative of the number of clock cycles of the processor during that observation time period. As another example, the hardware observation point 12 may measure a value and send an event each time the value changes or becomes a specific value. For instance, if the hardware observation point 12 is measuring an FSM and reporting events each time the FSM enters a specific state, the observer 14 would output observation data indicative of the number of times the FSM entered the specific state.

At some point after the N-th observation period (e.g., during the (N+1)-th observation time period), the collector hub 20 receives a trigger to capture one or more of the live-counters 18 (step 106). In one embodiment, the trigger is from an external system (i.e., external to the SoC) such as, for example, an external debug system. In another embodiment, the trigger may be generated internally within the SoC. In one embodiment, the trigger is a trigger to capture all of the live-counters 18. In another embodiment, the trigger is a trigger to capture a subset of the live-counters 18. For example, two or more different subsets of the live-counters 18 (or equivalently two or more different subsets of the hardware observation points 12 or observers 14) are defined. The trigger is then a trigger to capture the live-counters 18 for one or more of the subsets.

In response to the trigger, for each live-counter 18 to be captured, the collector hub 20 obtains the live-counter value from the live-counter 18 (step 108). The collector hub 20 stores live-counter value(s) from the live-counter(s) 18 in the corresponding frozen-counter(s) 22 (i.e., as corresponding frozen-count value(s)) (step 110). The collector hub 20 time-stamps the frozen-counter value(s) stored in the frozen-counter(s) 22 (step 112). At some point, either in response to the same trigger or in response to, e.g., a request from an internal or external debug system, the collector hub 20 outputs the frozen-counter value(s) from the frozen-counter(s) 22, including the time-stamp(s) of the corresponding frozen-counter value(s) (step 114). Preferably, the collector hub 20 time-stamps the frozen-counter value(s) stored in the frozen-counters 22 at the time that the live-counter value(s) were obtained by the collector hub 20 and stored in the frozen-counter(s) 22. But, outputting the frozen-counter value(s) from the frozen-counter(s) 22 may occur at a later time, depending on implementation and operation. Outputting the frozen-counter value(s) can be accomplished in many different ways, as will be discussed in more detail below. By counting the number of events at each of the hardware observation points 12 over one or more observation time period(s), and then outputting the frozen-counter values and corresponding time-stamps, the monitoring system 10 can, in some embodiments, enable detailed runtime monitoring, which can be used both for optimizing future hardware iterations and also to support software power optimizations.

Figure 3A:
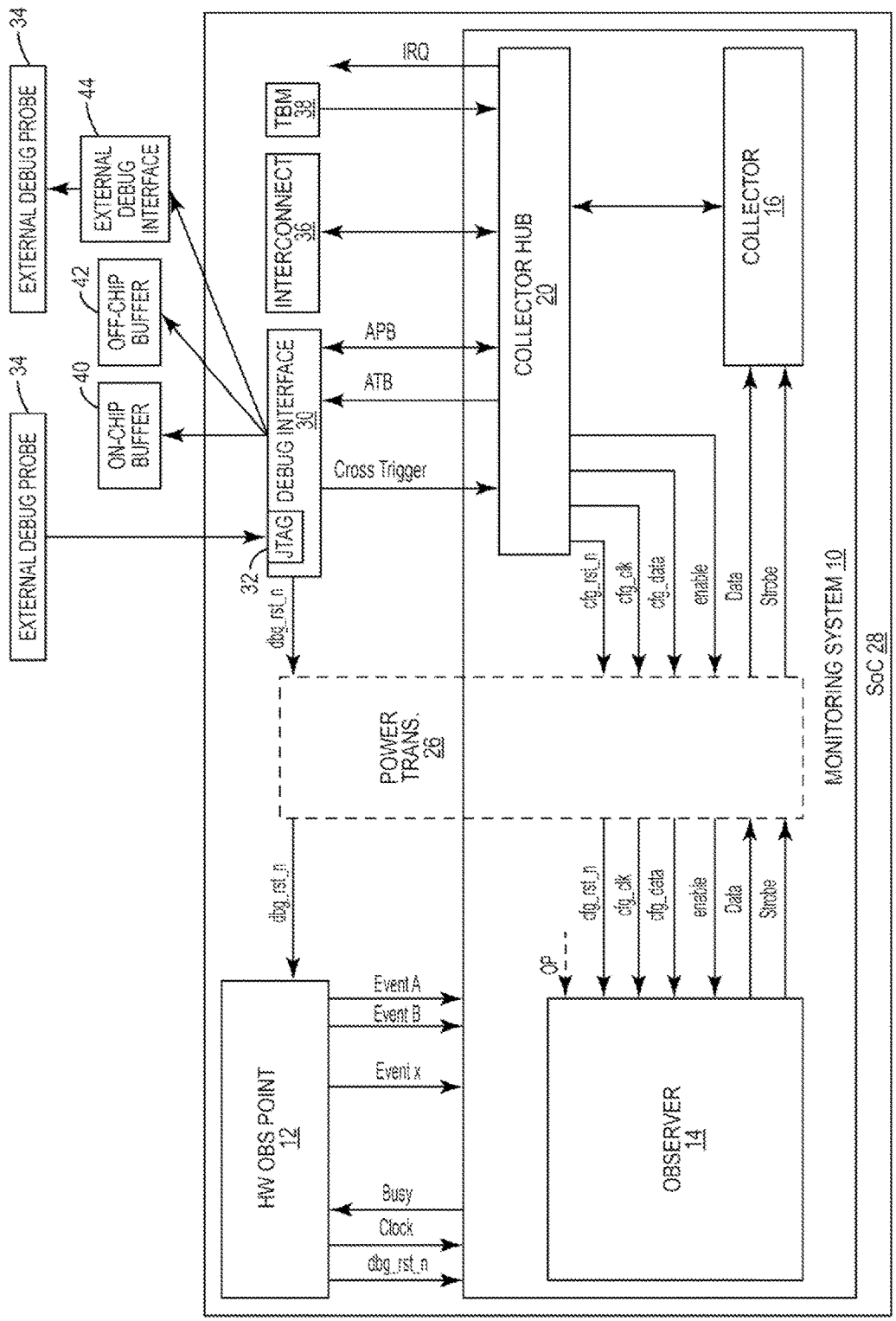
FIGS. 3A and 3B are more detailed block diagrams illustrating a monitoring system within an SoC for monitoring hardware observation points within the SoC according to another embodiment of the present disclosure.
Figure 3B:
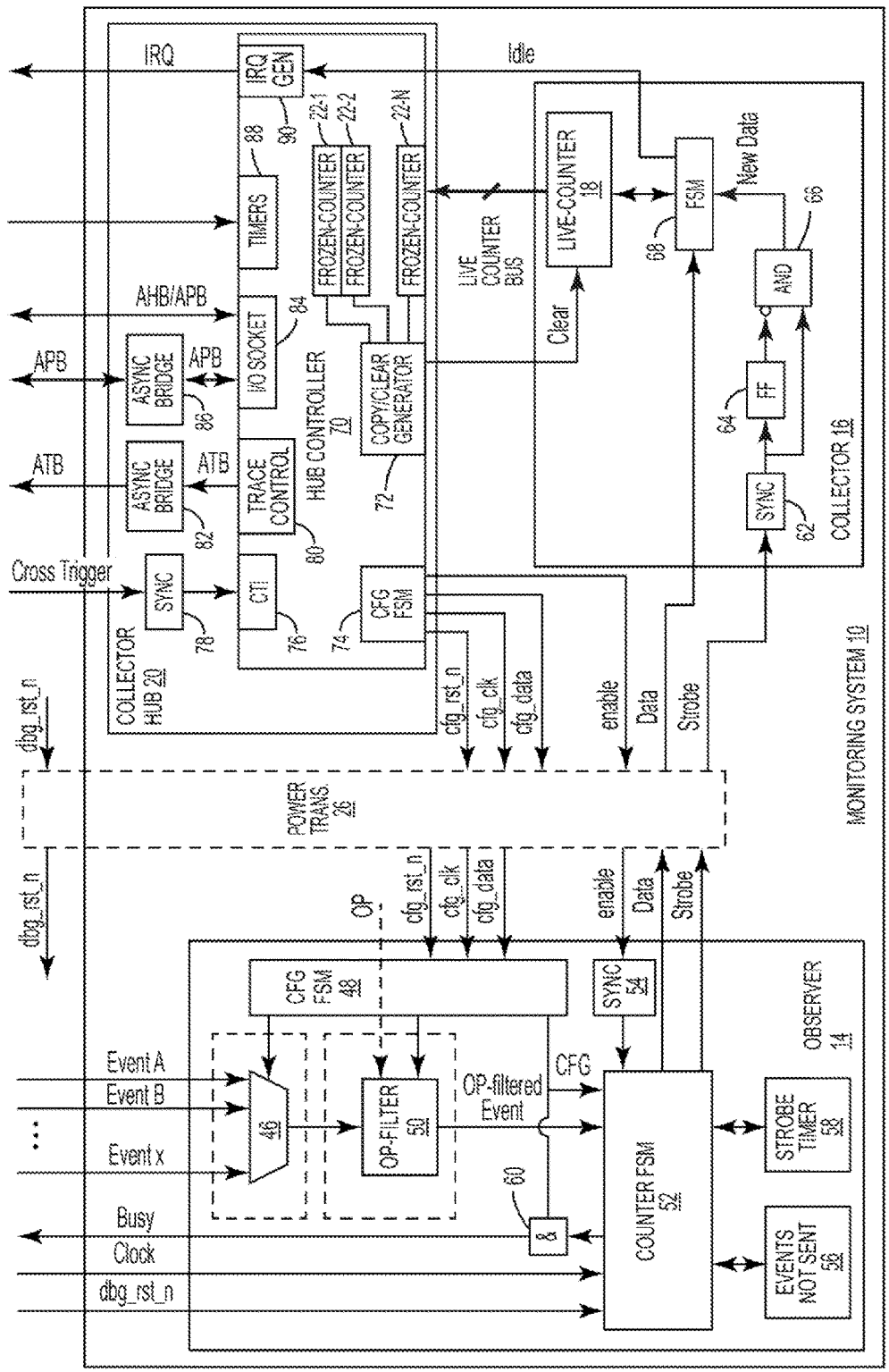

FIGS. 3A and 3B are more detailed block diagrams illustrating the monitoring system 10 within an SoC 28 according to another embodiment of the present disclosure. FIGS. 3A and 3B only show one hardware observation point 12, observer 14, and collector 16 for conciseness, but the monitoring system 10 preferably has many hardware observation points 12, corresponding observers 14, and collectors 16. The SoC 28 is shown to include the hardware observation point 12, the observer 14, the collector 16, the collector hub 20, the optional power translation circuitry 26, and various interconnects to the monitoring system 10.

FIG. 3A shows a high-level diagram of the relationship between the hardware observation point 12, the observer 14, the collector 16 and the collector hub 20, as previously described in reference to FIG. 1. In addition, FIG. 3A illustrates an embodiment where the hardware observation point 12 may provide more than one event stream (Event A through Event x) to the observer 14. In addition, the hardware observation point 12 may communicate a debug reset signal (dbg_rst_n) and a clock signal (Clock) to the observer 14. The observer 14 may also communicate a busy signal (Busy) to the hardware observation point 12. In some embodiments, the debug reset signal is used to reset many or all components of the observer 14 to a default value. The busy signal may indicate to the hardware observation point 12 that the observer 14 still has events to send to the collector 16. The hardware observation point 12 must provide the clock signal to the observer 14 as long as the busy signal is active. Once the busy signal goes inactive, the clock can stop toggling. In one embodiment, the hardware observation point 12 will only provide a clock signal when there is a chance that events may occur. This is a standard power saving mechanism called clock gating.

FIG. 3A also shows that the observer 14 may receive an optional operating point signal (OP) that indicates a current operating voltage, current clock frequency, or some other value indicative of the operating characteristics of the location on the SoC 28 where the observer 14 is located. In this embodiment, the observer 14 receives three configuration signals from the collector hub 20. The configuration signals include a configuration reset signal (cfg_rst_n), a configuration clock signal (cfg_clk), and a configuration data signal (cfg_data). In an embodiment including multiple observers 14, the observers 14 may all receive the same three configuration signals. The three configuration signals could be used to implement a serial protocol that allows the observers 14 to be addressed so that each one could be individually configured or so that two or more different subsets of the observers 14 could be individually configured. The collector hub 20 also communicates an enable signal (enable) that can be used to toggle the observer 14 on and off. As with the configuration signals, in some embodiments, each observer 14 shares a single enable signal that allows the collector hub 20 to activate and deactivate all of the observers 14 at once. In other embodiments, each observer 14 has its own enable signal or each of two or more different subsets of the observers 14 has its own enable signal.

FIG. 3A also shows the observer 14 sending a data signal (Data) (i.e., a signal carrying the observation data) and a strobe signal (Strobe) to the collector 16. In this embodiment, the strobe signal is used to indicate to the collector 16 when new observation data is available on the data signal. This process will be discussed in more detail in reference to FIG. 3B. As in FIG. 1, if the hardware observation point 12 and the observer 14 are in a different power domain than the collector 16 and the collector hub 20, optional power translation circuitry 26 is used to translate communications between elements in different power domains.

FIG. 3A shows various interconnects and inputs to the monitoring system 10. A debug interface 30 includes a Joint Test Action Group (JTAG) port 32 that can be accessed by an external debug probe 34 according to some embodiments. The debug interface 30 can communicate a cross trigger signal (Cross Trigger) to the collector hub 20 to enable interaction with other systems or other parts of the SoC 28. The collector hub 20 can communicate with the debug interface 30 using an Advanced Trace Bus (ATB) and an Advanced Peripheral Bus (APB). The collector hub 20 can also process various input/output (I/O) signals using an interconnect 36. The collector hub 20 can also receive a signal from a time-based module (TBM) 38 that may provide one or more time signals or a time vector, according to one embodiment. In this embodiment, the collector hub 20 can also produce an interrupt request signal (IRQ) which may indicate to a processor or other component that all observers 14 are idle and that the live-counters are stable. This can be useful to know when all events are collected and can be read out. The debug interface 30 of FIG. 3A is also in communication with an on-chip buffer 40, and off-chip buffer 42, and an external debug interface 44. In this embodiment, the external debug probe 34 can also be attached to the external debug interface 44.

FIG. 3B illustrates a more detailed view of the monitoring system 10 shown in FIG. 3A, according to one embodiment. Identical elements are given the same numbers and may not be discussed again in detail. The observer 14 is shown receiving multiple event streams (Event A through Event x) which each include some number (possibly zero) of events. An optional multiplexer 46 is provided to receive the multiple event streams. The multiplexer 46 can receive a signal from a configuration FSM 48 which indicates which of the multiple event streams to select for counting. The events may then be passed to an optional OP-filter 50 which may also be controlled by the configuration FSM 48. The OP-filter 50 can be configured to let events through to be counted based on the value of the OP signal. Events are then passed to a counter FSM 52 which also receives clock signal (Clock) and a debug reset signal (dbg_rst_n) from the hardware observation point 12 (not shown). The counter FSM 52 also receives a configuration signal (CFG) from the configuration FSM 48 and an enable signal (enable) from the collector hub 20. In this embodiment, the enable signal is shown passing through a sync block 54, which is used to synchronize the enable signal in case the observer 14 and the collector hub 20 are operating in different clock domains.

As discussed previously, the observer 14 is adapted to output observation data indicative of the number of events received from the corresponding hardware observation point 12 during each of a number of observation time periods. In the embodiment of FIG. 3B, the observer 14 accomplishes this by using the counter FSM 52 to maintain an events not sent counter 56 and a strobe timer 58. Each time an event is received by the observer 14 (which in this example is each time an event is passed through the optional multiplexer 46 and OP-filter 50), the counter FSM 52 increments the events not sent counter 56. The strobe timer 58 is incremented independently from the events not sent counter 56. When the strobe timer 58 reaches a specific value, the counter FSM 52 sends the observation data to the corresponding collector 16 as the data signal (Data) and toggles the strobe signal (Strobe), which will be discussed in more detail in relation to the collector 16. The strobe timer 58 defines the observation time period that provides a mechanism to define the timing of the reporting of events. In some embodiments, the rate at which events are or can be received is much higher than the rate at which the observer 14 is configured to send the observation data to the collector 16.

The duration of the strobe timer 58 should be short enough that the events not sent counter 56 is not likely to overflow before the observation data is sent, and long enough that the observer 14 is not sending the observation data to the collector 16 more frequently than the collector 16 can handle. In one embodiment, the strobe timer 58 contains m bits, and when the most significant bit changes from zero to one, the counter FSM 52 triggers the strobe signal and toggles the data signal as required to thereby send the observation data that is indicative of the value of the events not sent counter 56 (i.e., the number of events received during the observation time period plus the number of events not sent during a previous observation time period(s)). In response to sending out the observation data, the counter FSM 52 decrements the events not sent counter 56 by the amount that was indicated by the observation data. For instance, if the events not sent counter 56 has a value of 260 when the strobe timer 58 indicates that observation data should be sent and the observation data sent indicates that 256 events have been received (as will be discussed in more detail below), the counter FSM 52 will decrement the events not sent counter 56 by 256 and the updated value will be four, indicating that four events have not yet been sent to the collector 16. The counter FSM 52 will continue to maintain the events not sent counter 56 by incrementing the events not sent counter 56 when events are received and decrementing the events not sent counter 56 in response to sending observation data to the collector 16 in additional observation time periods.

The counter FSM 52 and the configuration FSM 48 are each able to send a busy signal (Busy) to the hardware observation point 12 (not shown) as discussed in relation to FIG. 3A. In this embodiment, the two busy signals are combined at a combiner 60 such that if the configuration FSM 48, the counter FSM 52, or both the configuration FSM 48 and the counter FSM 52 sends a busy signal, the hardware observation point 12 will receive the busy signal. In another embodiment, the signal from the configuration FSM 48 disables the busy signal from the counter FSM 52. This may be used, for instance, if the hardware observation point 12 is a clock, because the clock will run as long as the busy signal is active. By gating the busy signal, the clock will stop when the hardware observation point 12 no longer needs the clock, and then the observer 14 will also stop. When the clock comes back later, the observer 14 will continue from the previous state.

FIG. 3B illustrates that the collector 16 includes a live-counter 18, as discussed above. The data signal (Data) and the strobe signal (Strobe) are received from the observer 14. In this embodiment, the strobe signal is normally low, and when the strobe signal is switched from low to high, it indicates that new data is available on the data signal. The collector 16 includes a sync block 62 which operates in a similar way to the sync block 54 and provides for synchronization across different clock domains. The collector 16 also includes a flip-flop 64 and a logical AND 66, which together provide a new data signal (New Data) to an FSM 68 only when the strobe signal has transitioned from a logical zero to a logical one. The FSM 68 is then able to read the observation data sent in the data signal and use this to maintain the live-counter 18. In this embodiment, the observation data is sent as a two-bit symbol, where "00" indicates that the live-counter 18 should not be changed, "01" indicates that the live-counter 18 should be increased by one, "10" indicates that the live-counter 18 should be decreased by one, and "11" indicates that the live-counter 18 should be increased by $2^m$ for some integer m. This is why the previous example indicated that the observation data indicated that 256 (m=8) events were received. By using observation data that is a bit pattern from a defined set of bit patterns, where a first bit pattern of the defined set of bit patterns corresponds to an increment to the live-counter 18 by a first value and a second bit pattern of the defined set of bit patterns corresponds to an increment to the live-counter by a second value that is different from the first value, the observer 14 can communicate with the collector 16 in an efficient manner, according to one embodiment. This efficiency may result from only using three signals in a standardized protocol that is independent of the value of m.

The collector hub 20 includes a hub controller 70 that includes a copy/clear generator 72 connected to a plurality of frozen-counters 22. The hub controller 70 also includes a configuration FSM 74 capable of sending out the configuration signals, discussed previously, to each of the observers 14, and also capable of sending the enable signal (enable). The hub controller 70 also includes a cross trigger interface (CTI) 76 for receiving the cross trigger signal (as previously discussed with respect to FIG. 3A). In this embodiment, the cross trigger signal passes through a sync block 78, which provides for synchronization across different clock domains. The hub controller 70 also includes a trace controller 80, which can generate the ATB signal discussed previously with respect to FIG. 3A. In this embodiment, the ATB signal passes through an asynchronous bridge 82, which also provides for communications across different clock domains. The hub controller 70 includes an I/O socket 84, which can provide an APB signal to the debug interface 30 (FIG. 3A) and can provide an advanced high-performance bus (AHB) or APB signal to the interconnect 36 (FIG. 3A) (AHB and APB are both unregistered trademarks of ARM Ltd.). The APB signal to the debug interface 30 passes through an asynchronous bridge 86 which provides for communication across different clock domains. The hub controller 70 includes one or more timers 88 that receive time signals or a time vector from the TBM 38 (FIG. 3A).

When the collector hub 20 receives a trigger to capture the live-counter 18 of one or more of the plurality of collectors 16, the hub controller 70 uses the copy/clear generator 72 to obtain the live-counter value from the live-counter 18 of the collector 16 and, in some embodiments, clear the value of the live-counter 18 so that subsequent values start counting again at zero. This is only one implementation, and other implementations may be used. The collector hub 20 stores the live-counter value obtained from the live-counter 18 as a frozen-counter value in the corresponding frozen-counter 22 and time-stamps the frozen-counter value using a time signal obtained by the timers 88. The collector hub 20 can then output the frozen-counter value from the frozen-counter 22 including the time-stamp of the frozen-counter value. Depending on the implementation, or on where the trigger to capture the one or more live-counters 18 came from, the collector hub 20 may output the frozen-counter value and the corresponding time-stamp as an ATB signal to the debug interface 30 (FIG. 3A) or allow the value to be read by software by, for example, sending an APB signal to the interconnect 36 (FIG. 3A). The collector hub 20 also includes an IRQ generator 90 for generating an IRQ signal, as discussed previously.

The collector hub 20 may receive a trigger to capture the live-counter 18 of one or more of the plurality of collectors 16 in various ways. The collector hub 20 may receive the trigger as a cross trigger signal on the CTI 76. The collector hub 20 may also receive the trigger as a software signal received on the APB or other bus. The collector hub 20 may also receive the trigger as a recurring timer that triggers the capture of the value of live-counter 18 of one or more of the plurality of collectors 16 periodically. This recurring timer may be obtained in any way or may be generated by the collector hub 20 based on some configuration. The collector hub 20 may also receive multiple triggers from any combination of these or other sources.

Figure 4A:
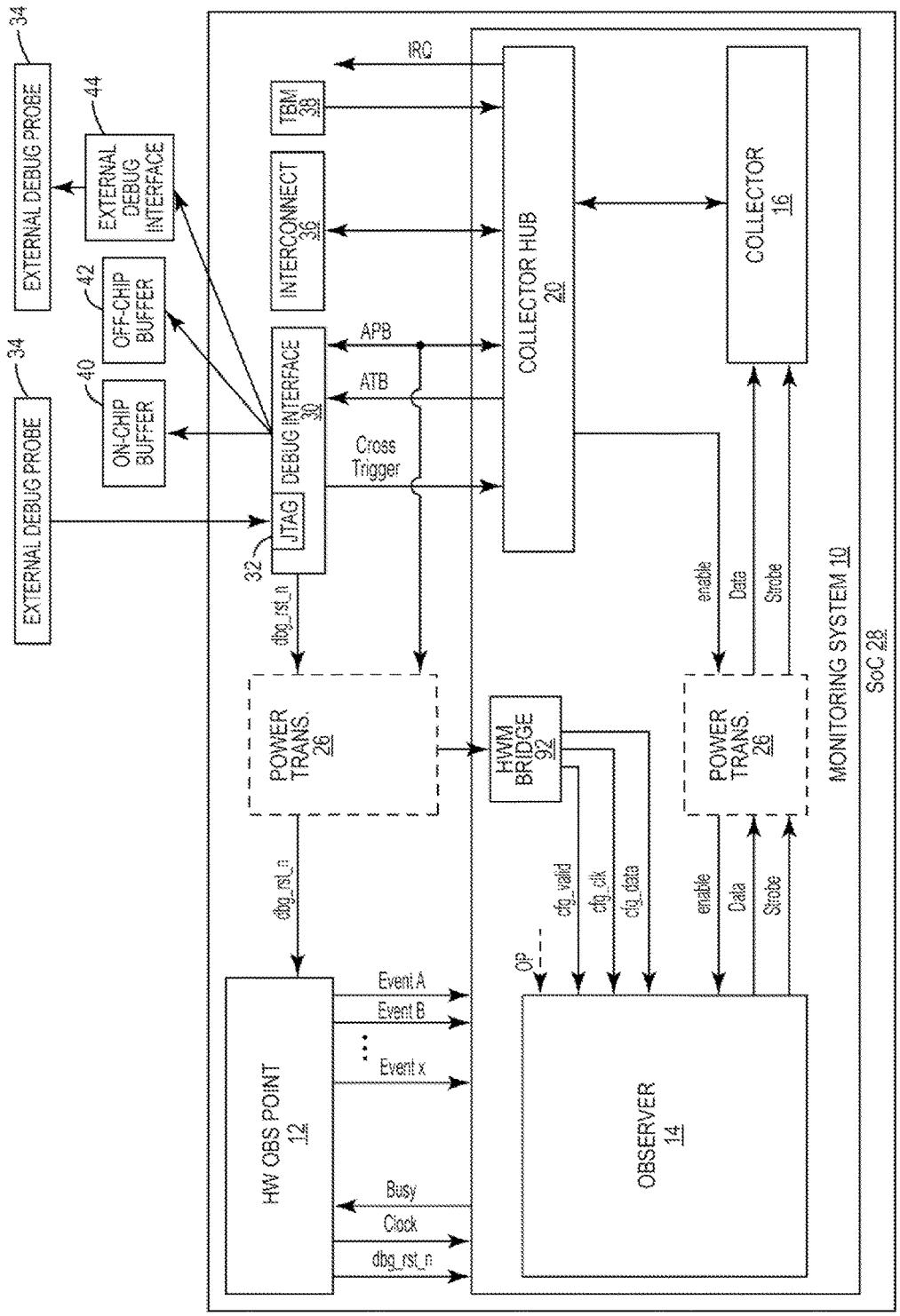
FIGS. 4A and 4B are more detailed block diagrams illustrating a monitoring system within an SoC for monitoring hardware observation points within the SoC according to another embodiment of the present disclosure.
Figure 4B:
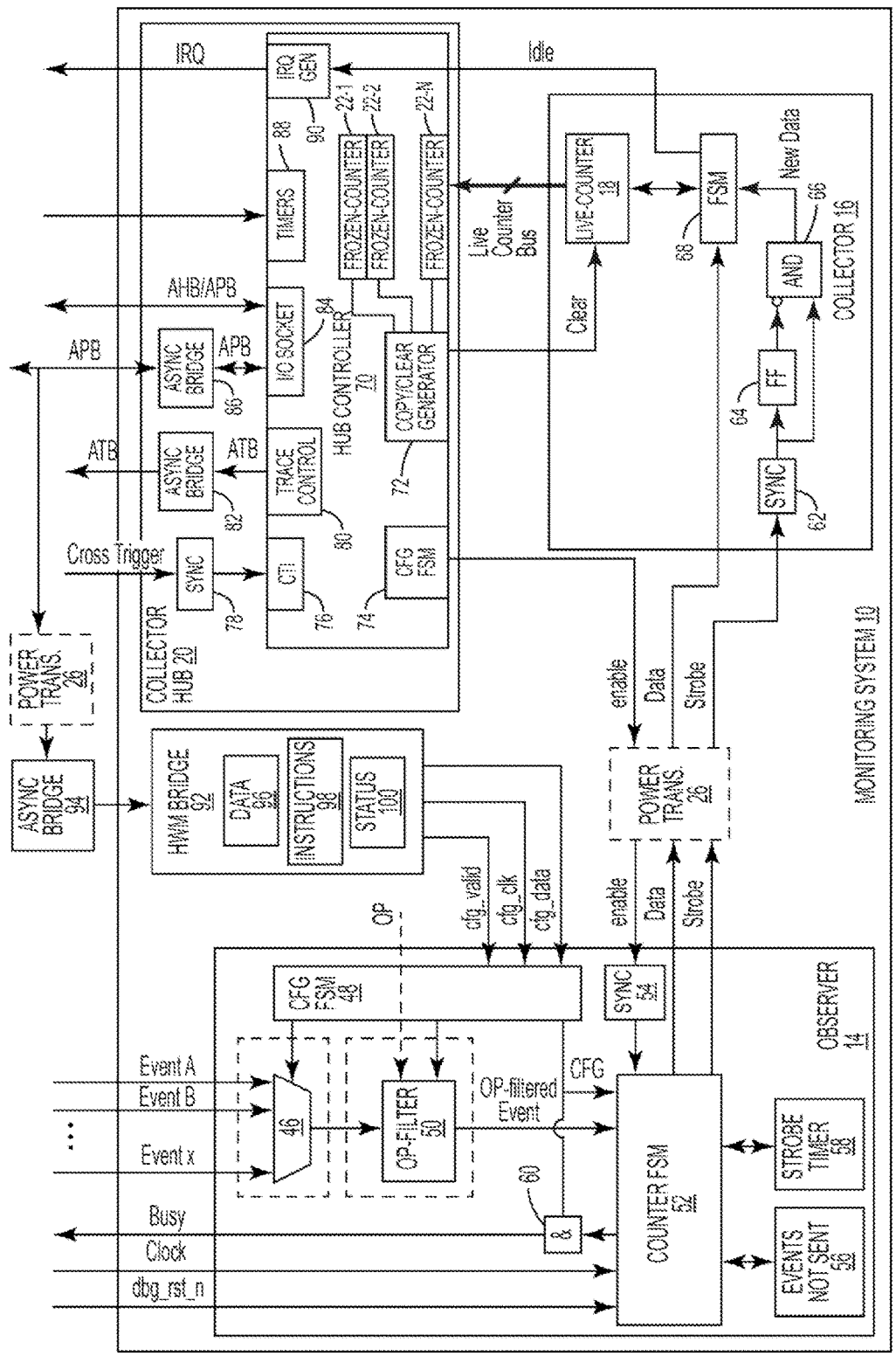

FIGS. 4A and 4B illustrate the monitoring system 10 according to another embodiment that is similar to that of FIGS. 3A and 3B, except that instead of the collector hub 20 sending configuration signals to each of the observers 14 through a serial protocol using three signals, the collector hub 20 sends configuration signals to each of the observers 14 using a parallel configuration signal sent through the APB. In this regard, FIG. 4A shows that the parallel configuration signal is received by a hardware monitor bridge 92. The hardware monitor bridge 92 translates the parallel configuration signal into three configuration signals that are sent to the observer 14. As in the embodiment of FIGS. 3A and 3B, two of the configuration signals are a configuration clock signal (cfg_clk) and a configuration data signal (cfg_data). But, instead of the configuration reset signal (cfg_rst_n used in FIGS. 3A and 3B), the hardware monitor bridge 92 generates a configuration valid signal (cfg_valid). Where the embodiment of FIGS. 3A and 3B provided the same configuration signals to each observer 14 and used addressing to configure different observers 14 differently, the hardware monitor bridge 92 provides the addressing by providing the configuration valid signal to an observer 14 if the configuration being transmitted on the configuration data signal is for that observer 14.

FIG. 4B illustrates a more detailed view of the monitoring system 10 shown in FIG. 4A, according to one embodiment. Identical elements are given the same numbers and may not be discussed again in detail. As discussed above, the monitoring system 10 of FIG. 4B is similar to the one shown in FIG. 3B except for how the configuration signals are sent to the observers 14. In this regard, FIG. 4B shows that a parallel configuration signal is provided on the APB. This parallel configuration signal is received by a hardware monitor bridge 92. There is a hardware monitor bridge 92 in the clock and power domain of each observer 14. As such, the parallel configuration signal passes through an asynchronous bridge 94, which provides for communication across different clock domains. In this embodiment, the hardware monitor bridge 92 includes data 96, instructions 98, and status indicators 100. The hardware monitor bridge 92 uses these to decode the received parallel configuration signal into the appropriate serial configuration signals for each observer 14.

Figure 5:
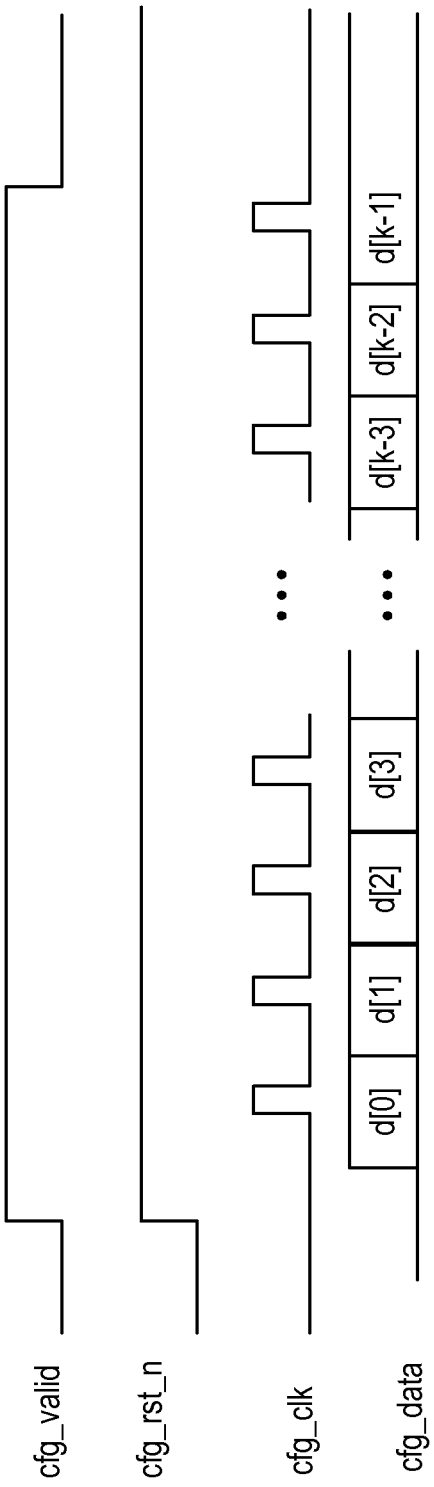
FIG. 5 illustrates configuration signals that may be sent to one or more observers in the monitoring systems of FIGS. 3A and 3B or FIGS. 4A and 4B, according to one embodiment of the present disclosure.

FIG. 5 illustrates configuration signals that may be sent to one or more observers 14 in the monitoring system 10 of FIG. 3A or 4A, according to one embodiment of the present disclosure. When a configuration is ready to be sent over the configuration data signal (cfg_data), the configuration reset signal (cfg_rst_n) of FIGS. 3A and 3B transitions from the default low value to a high value. This configuration reset signal alerts each observer 14 to inspect the data received on the configuration data signal to, in some embodiments, determine whether the configuration is applicable to that observer 14 and, if so, determine the configuration. The configuration data signal is shown in FIG. 5 as k bits labelled d[0] through d[k−1]. The observer 14 samples the configuration data signal on the rising edge of the configuration clock signal (cfg_clk). This is only one possible implementation and others are possible.

In the embodiment illustrated in FIGS. 4A and 4B, when a configuration is ready to be sent over the configuration data signal, the hardware monitor bridge 92 generates a configuration valid signal (cfg_valid) that transitions from the default low value to a high value. This configuration valid signal lets the observer 14 know that the configuration on the configuration data signal is for that observer 14 instead of decoding an address from the configuration data signal. The observer 14 samples the configuration data signal on the rising edge of the configuration clock signal (cfg_clk). This is only one possible implementation and others are possible.

Figure 6A:
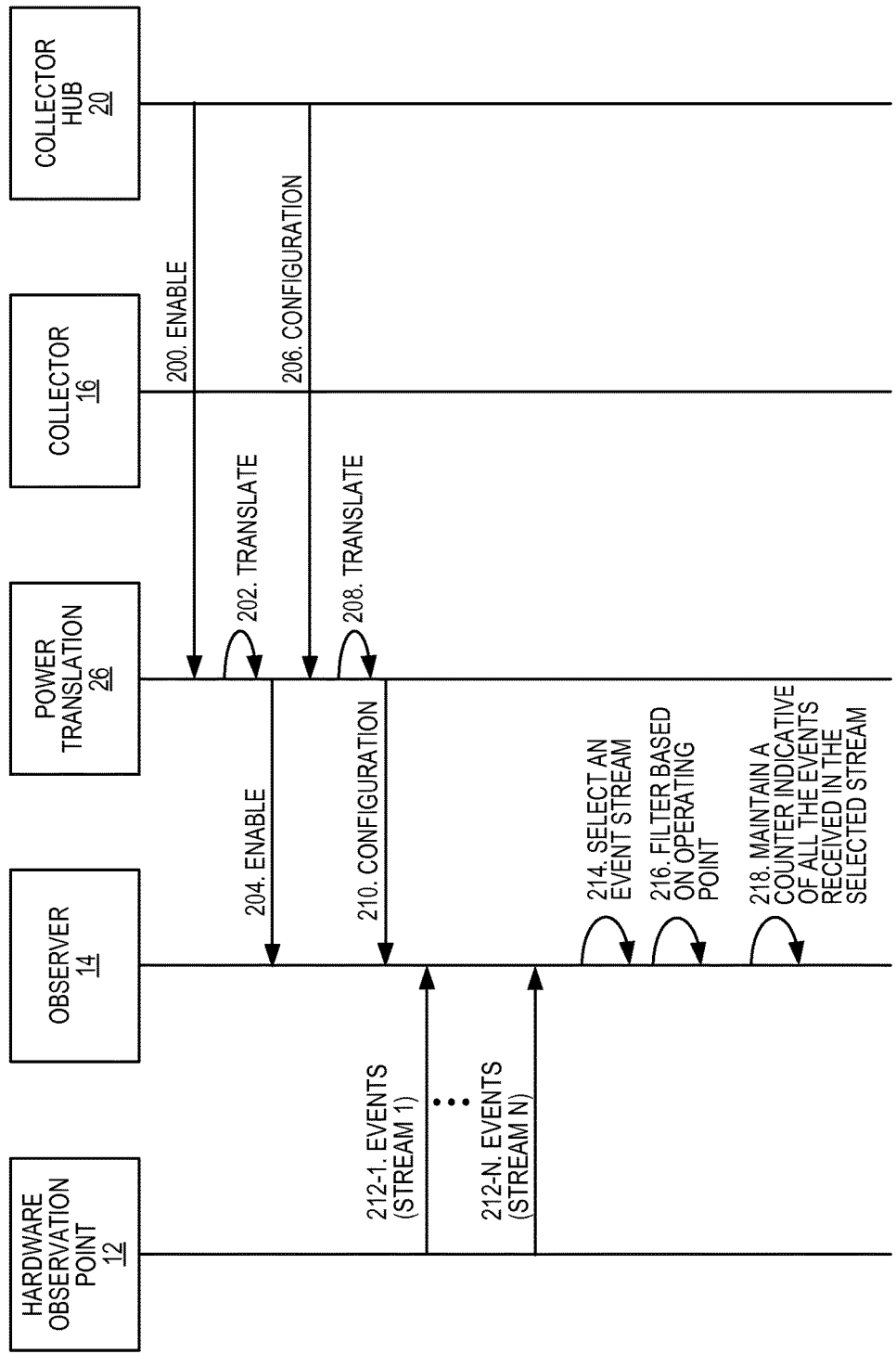
FIGS. 6A and 6B illustrate the operation of the monitoring systems of FIGS. 3A and 3B or FIGS. 4A and 4B according to one embodiment of the present disclosure.
Figure 6B:
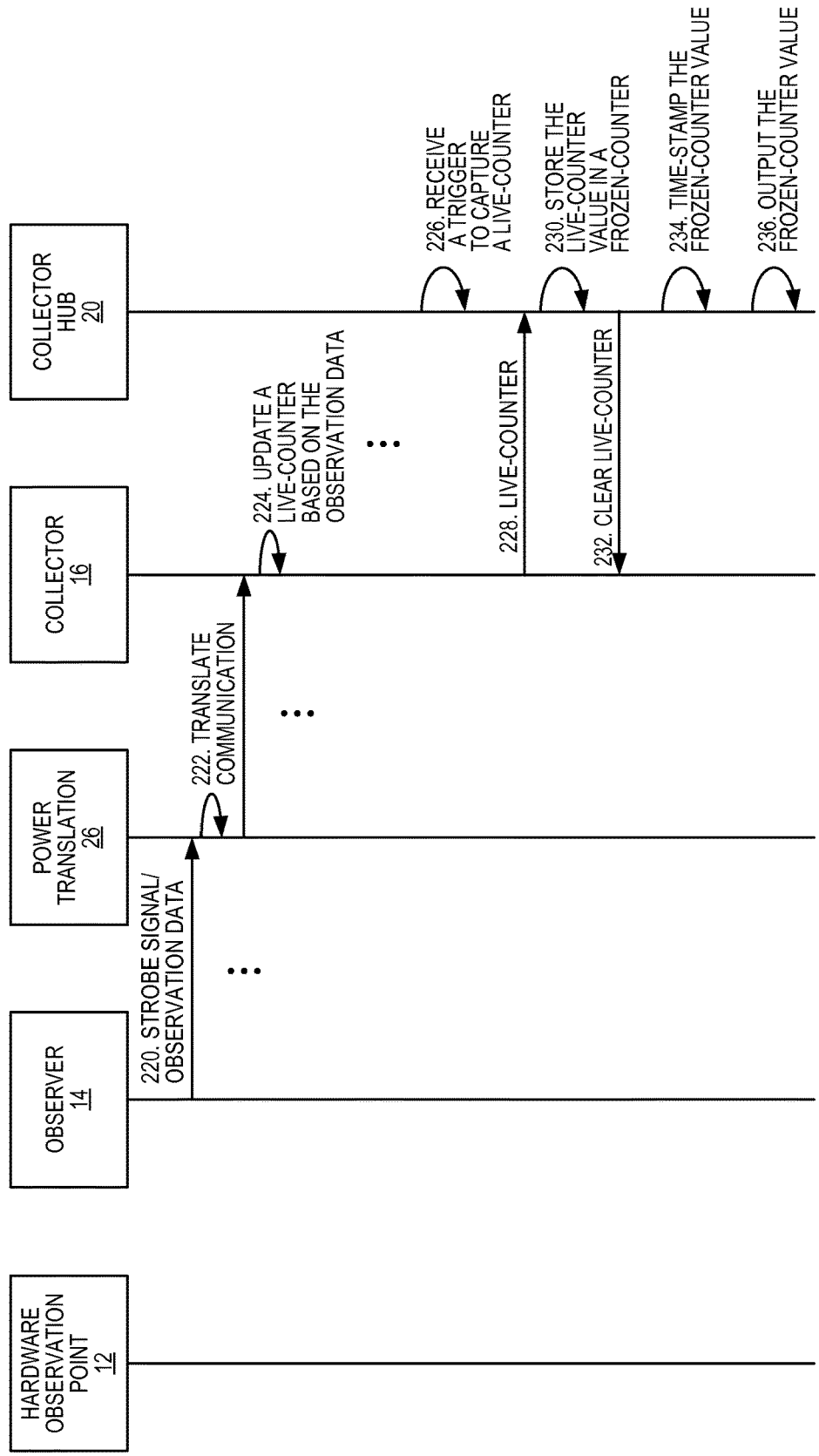

FIGS. 6A and 6B illustrate the operation of the monitoring system 10 of FIGS. 3A and 3B or FIGS. 4A and 4B according to one embodiment of the present disclosure. For clarity and conciseness, only one hardware observation point 12 and corresponding observer 14 and collector 16 are shown. However, the process can be used for any number of hardware observation points 12 and corresponding observers 14 and collectors 16.

As illustrated, the collector hub 20 sends an enable signal to an observer 14 by sending the enable signal to power translation circuitry 26 (step 200). The power translation circuitry 26 translates the enable signal from the power domain of the collector hub 20 into the power domain of the observer 14 (step 202) and then communicates the translated enable signal to the observer 14 (step 204). The collector hub 20 then sends a configuration signal to the observer 14 by sending the configuration signal to power translation circuitry 26 (step 206). The power translation circuitry 26 translates the configuration signal from the power domain of the collector hub 20 into the power domain of the observer 14 (step 208) and then communicates the translated configuration signal to the observer 14 (step 210). The configuration signal can be sent using either of the embodiments disclosed in FIGS. 3A and 3B or FIGS. 4A and 4B.

The observer 14 receives multiple event streams (Stream 1 through Stream N) from the hardware observation point 12 (steps 212-1 through 212-N). The observer 14 uses the multiplexer 46 to select one stream of the multiple streams of events to process (step 214). The selected event stream is then filtered by the OP-filter 50 based on the operating point (step 216). The observer 14 uses the OP-filter 50 to pass only those events that occur when the operating point is a specific value. Notably, both the multiplexer 46 and the OP-filter 50 are optional (e.g., when there is only one event stream and/or when no filtering is desired, they may be excluded). The observer 14 maintains a counter indicative of all the events received in the selected stream of events that, if filtering is used, passed through the OP-filter 50 for an observation time period (step 218). More specifically, at the observer 14, the counter FSM 52 increments the events not sent counter 56 for each received event (i.e., in this example, for each received event of the selected event stream that passes through the OP-filter 50).

FIG. 6B continues the process of FIG. 6A. The observer 14 then sends observation data for the observation time period along with the appropriate strobe signal to the power translation circuitry 26 (steps 220). The power translation circuitry 26 translates the communications from the power domain of the observer 14 into the power domain of the collector 16 and then communicates the translated observation data and strobe signal to the collector 16 (steps 222). The collector 16 receives the observation data and corresponding strobe signal and updates the live-counter 18 based on the observation data (step 224). The process continues in this manner for one or more additional observation time periods.

As some point, the collector hub 20 receives a trigger to capture the live-counter 18 (step 226). In response, the collector hub 20 obtains a live-counter value from the live-counter 18 of the collector 16 (step 228) and stores the live-counter value in the corresponding frozen-counter 22 (step 230). The collector hub 20 then clears the live-counter 18 (step 232). The collector hub 20 time-stamps the frozen-counter value stored in the frozen-counter 22 (step 234). The collector hub 20 can then output the frozen-counter value from the frozen-counter 22 (step 236).

As discussed previously, by counting the number of events at each of the hardware observation points 12, the monitoring system 10 can, in some embodiments, enable detailed runtime monitoring, which can be used for optimizing future hardware iterations and to support software power optimizations. More specifically, there are several benefits of having knowledge about the current hardware state. Being able to monitor the hardware observation points 12 can help debug hardware by determining, for example, if a connection is faulty or if a value changes when it should not. Being able to monitor the hardware observation points 12 can also help debug software implemented on the system by determining, for example, if a processor is active when not intended to be, or if a state in an FSM is never entered or entered too frequently. Being able to monitor the hardware observation points 12 can also be a tool to optimize power consumption in a system. For example, this can be accomplished because the monitoring system 10 enables observing many (perhaps hundreds or more) events, such as clocks and states, which each require high sample rates, in an efficient manner. This can be very important in mobile low-power designs, for example, as understanding the activity of the hardware is very important in order to be able to accurately model the power consumption of the hardware. In one example, the monitoring system 10 may be able to determine that a specific processor can be deactivated based on the number of events generated by that processor in the past hour. Or, the monitoring system 10 may determine that an entire power domain of the SoC 28 can shut down in order to reduce power consumption. These are only some example uses and embodiments of the monitoring system 10, and the present disclosure is not limited thereto.

The following acronyms are used throughout this disclosure.

AHB Advanced High-Performance Bus
APB Advanced Peripheral Bus
ATB Advanced Trace Bus
CPU Central Processing Unit
CTI Cross Trigger Interface
FSM Finite State Machine
I/O Input/Output
IC Integrated Circuit
JTAG Joint Test Action Group
OP Operating Point
SoC System on a Chip
TBM Time-Based Module Those skilled in the art will recognize improvements and modifications to the embodiments of the present disclosure. All such improvements and modifications are considered within the scope of the concepts disclosed herein and the claims that follow.

What is claimed is:

1. A monitoring system within a System on a Chip (SoC) for monitoring a plurality of hardware observation points within the SoC, comprising:
 a plurality of observers electrically coupled to the plurality of hardware observation points in the SoC, each observer among the plurality of observers configured to, for each observation time period of one or more observation time periods for the observer:
  receive a number of events from a corresponding hardware observation point among the plurality of hardware observation points during the observation time period, wherein the observer and the corresponding hardware observation point operate in the same clock and power domain of the SoC; and
  output observation data indicative of the number of events received from the corresponding hardware observation point during the observation time period;
 a plurality of collectors, each collector among the plurality of collectors configured to:
  receive the observation data from a corresponding observer among the plurality of observers for the one or more observation time periods for the corresponding observer;
  update a value of a live-counter based on the observation data from the corresponding observer for each of the one or more observation time periods for the corresponding observer; and
  output the value of the live-counter; and
 a collector hub, coupled to the plurality of collectors, configured to:
  receive a trigger to capture the value of the live-counter of one or more of the plurality of collectors;
  in response to the trigger, for each value of the live-counter of the one or more of the plurality of collectors:
   obtain the value of the live-counter from the collector;
   store the value of the live-counter as a corresponding value of a frozen-counter of a plurality of frozen-counters for the plurality of collectors;
   time-stamp the corresponding value of the frozen-counter; and
   output the corresponding value of the frozen-counter including the time-stamp of the corresponding value of the frozen-counter.

2. The monitoring system of claim 1 wherein each observer among the plurality of observers comprises:
 an event input port electrically coupled to the corresponding hardware observation point;

a data output port; and circuitry configured to, for each observation time period of the one or more observation time periods of the observer:
- maintain a counter indicative of the number of events received via the event input port during the observation time period; and
- output the observation data on the data output port, the observation data being indicative of the number of events received via the event input port during the observation time period.

3. The monitoring system of claim 2 wherein each collector among the plurality of collectors comprises:
- a data input port configured to receive the observation data from a corresponding observer among the plurality of observers; and
- circuitry configured to, for each observation time period of the one or more observation time periods of the corresponding observer:
  - receive, via the data input port, the observation data from the corresponding observer for the observation time period; and
  - update the value of the live-counter based on the observation data.

4. The monitoring system of claim 2 wherein the circuitry of each observer among the plurality of observers is configured to, for each observation time period of the one or more observation time periods of the observer, maintain the counter as the summation of the number of events received via the event input port during the observation time period and a number of events received but not reported as observation data for any previous observation time period; and
the circuitry of each observer among the plurality of observers is further configured to decrement the counter by an amount indicated by the observation data output on the data output port.

5. The monitoring system of claim 1 wherein at least one observer among the plurality of observers is further configured to:
- filter an event stream from the corresponding hardware observation point based on an operating point of the corresponding hardware observation point to provide a filtered event stream;
- wherein the number of events received from the corresponding hardware observation point during the observation time period is a number of events received in the filtered event stream during the observation time period.

6. The monitoring system of claim 1 wherein at least one observer among the plurality of observers further comprises:
- two or more event input ports electrically coupled to the corresponding hardware observation point;
- a multiplexer having two or more multiplexer input ports electrically coupled to the two or more event input ports and a multiplexer output port; and
- a data output port;
- circuitry configured to, for each observation time period of the one or more observation time periods of the observer:
  - maintain a counter indicative of the number of events received on a select one of the two or more event input ports at the multiplexer output port during the observation time period; and
  - output the observation data on the data output port, the observation data being indicative of the number of events received on the select one of the two or more event input ports during the observation time period.

7. The monitoring system of claim 1 wherein the collector hub comprises:
- a plurality of live-counter input ports, each live-counter input port among the plurality of live-counter input ports electrically coupled to the data output port of a corresponding collector among the plurality of collectors; and
- a controller unit configured to:
  - receive a trigger to capture the value of the live-counter of one or more of the plurality of collectors; and
  - in response to the trigger, for each value of the live-counter among the one or more of the plurality of collectors:
    - obtain the value of the live-counter from the live-counter input port of the collector;
    - store the value of the live-counter as a corresponding value of a frozen-counter;
    - time-stamp the corresponding value of the frozen-counter; and
    - output the corresponding value of the frozen-counter including the time-stamp of the corresponding value of the frozen-counter.

8. The monitoring system of claim 1, wherein each collector among the plurality of collectors and the collector hub operate in the same clock and power domain.

9. The monitoring system of claim 1 wherein each collector among the plurality of collectors operates in the same clock and power domain.

10. The monitoring system of claim 9 wherein at least one observer among the plurality of observers operates in a clock and power domain that is different from the same clock and power domain of the plurality of collectors.

11. The monitoring system of claim 10, further comprising power translation circuitry configured to translate communications between the clock and power domain of the at least one observer and the clock and power domain of the plurality of collectors.

12. The monitoring system of claim 1 wherein at least one observer among the plurality of observers is located inside the corresponding hardware observation point.

13. The monitoring system of claim 1 wherein at least one observer among the plurality of observers is located adjacent to the corresponding hardware observation point.

14. The monitoring system of claim 1 wherein at least two of the plurality of hardware observation points operate in different clock and power domains.

15. The monitoring system of claim 1 wherein the observation data is a bit pattern from a defined set of bit patterns, each corresponding to a different adjustment to the value of the live-counter.

16. The monitoring system of claim 15 wherein a first bit pattern of the defined set of bit patterns corresponds to an increment to the value of the live-counter by a first value and a second bit pattern of the defined set of bit patterns corresponds to an increment to the value of the live-counter by a second value that is different from the first value.

17. The monitoring system of claim 1 wherein at least one observer among the plurality of observers is configurable.

18. The monitoring system of claim 17 wherein at least one configuration of the at least one observer is configurable, the at least one configuration comprising one or more configurations selected from the group consisting of:
- a configuration indicative of which event type from two or more event types of the corresponding hardware observation point are to be counted;

a configuration indicative of when to receive events from the hardware observation point based on an operating point value;

a configuration indicative of a length of the observation time period; and a configuration enabling the observer.

19. The monitoring system of claim 17 wherein each observer among the plurality of observers is configurable via a same one or more configuration signals.

20. The monitoring system of claim 1, wherein the collector hub is configured to receive a trigger to capture the value of the live-counter of one or more of the plurality of collectors by being configured to receive a trigger to capture the value of the live-counter of one or more of the plurality of collectors selected from the group consisting of:

receiving a hardware trigger via a cross-trigger interface;
receiving a software trigger; and
receiving a recurring trigger based on a timer.

21. The monitoring system of claim 1, wherein the collector hub is configured to output the corresponding value of the frozen-counter including the time-stamp of the corresponding value of the frozen-counter by being configured to allow the corresponding value of the frozen-counter including the time-stamp of the corresponding value of the frozen-counter to be read by software.

22. The monitoring system of claim 1, wherein the collector hub is configured to output the corresponding value of the frozen-counter including the time-stamp of the corresponding value of the frozen-counter by being configured to send the corresponding value of the frozen-counter including the time-stamp of the corresponding value of the frozen-counter over a trace interface.

23. A method for monitoring a hardware observation points within a System on a Chip (SoC), comprising:

receiving, by an observer, a number of events from the hardware observation point during an observation time period;

outputting observation data indicative of the number of events received from the first hardware observation point during the observation time period;

receiving, by a collector, the observation data from the observer for the observation time period;

updating a value of a live-counter based on the observation data from the observer for the observation time period;

repeating the steps of receiving a number of events, outputting observation data, receiving the observation data, and updating the value of the live-counter for one or more additional observation time periods;

outputting the value of the live-counter;

receiving, by a collector hub coupled to the collector, a trigger to capture the value of the live-counter of the collector; and in response to the trigger:

obtaining the value of the live-counter from the collector;

storing the value of the live-counter as a corresponding value of a frozen-counter;

time-stamping the corresponding value of the frozen-counter; and outputting the corresponding value of the frozen-counter including the time-stamp of the corresponding value of the frozen-counter.

* * * * *